United States Patent
Orlowski et al.

(10) Patent No.: US 7,872,311 B2
(45) Date of Patent: Jan. 18, 2011

(54) METHOD AND APPARATUS FOR MOBILITY ENHANCEMENT IN A SEMICONDUCTOR DEVICE

(75) Inventors: Marius K. Orlowski, Austin, TX (US); Suresh Venkatesan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 255 days.

(21) Appl. No.: 11/857,122

(22) Filed: Sep. 18, 2007

(65) Prior Publication Data

US 2008/0006880 A1 Jan. 10, 2008

Related U.S. Application Data

(62) Division of application No. 10/925,108, filed on Aug. 24, 2004, now Pat. No. 7,288,448.

(51) Int. Cl.
H01L 29/76 (2006.01)

(52) U.S. Cl. ............................... 257/369; 257/E29.226; 257/192

(58) Field of Classification Search .................. 257/369, 257/E21.43, 63, 65, 192, 616, E29.226, E29.056, 257/335, 615, 288
See application file for complete search history.

(56) References Cited

U.S. PATENT DOCUMENTS

| | | | |
|---|---|---|---|
| 5,849,440 A | 12/1998 | Lucas et al. | |
| 5,858,830 A | 1/1999 | Yoo et al. | |
| 6,103,020 A | 8/2000 | Roberts et al. | |
| 6,197,632 B1 | 3/2001 | Bronner et al. | |
| 6,541,382 B1 | 4/2003 | Cheng et al. | |
| 6,605,498 B1 | 8/2003 | Murthy et al. | |
| 6,621,131 B2 | 9/2003 | Murthy et al. | |
| 6,825,507 B2 | 11/2004 | Aihara | |
| 2002/0011628 A1* | 1/2002 | Takagi | 257/368 |
| 2003/0080361 A1* | 5/2003 | Murthy et al. | 257/288 |
| 2004/0036122 A1* | 2/2004 | Aihara | 257/368 |
| 2004/0061191 A1 | 4/2004 | Paton et al. | |

(Continued)

FOREIGN PATENT DOCUMENTS

WO 0245156 A2 6/2002

OTHER PUBLICATIONS

Lander et al., "High Hole Mobilities in Fully-Strained Si1—xGex Layers (0.3 < x < 0.4) and Their Significance for SiGe pMOSFET Performance," IEEE Transactions on Electron Devices, vol. 48, No. 8, Aug. 2001, pp. 1826-1832.

(Continued)

Primary Examiner—Thomas L Dickey
Assistant Examiner—Fazli Erdem
(74) Attorney, Agent, or Firm—James L. Clingan, Jr.; Daniel D. Hill

(57) ABSTRACT

A method and apparatus is presented that provides mobility enhancement in the channel region of a transistor. In one embodiment, a channel region (18) is formed over a substrate that is bi-axially stressed. Source (30) and drain (32) regions are formed over the substrate. The source and drain regions provide an additional uni-axial stress to the bi-axially stressed channel region. The uni-axial stress and the bi-axially stress are both compressive for P-channel transistors and tensile for N-channel transistors. Both transistor types can be included on the same integrated circuit.

5 Claims, 4 Drawing Sheets

U.S. PATENT DOCUMENTS

| | | | |
|---|---|---|---|
| 2004/0084735 | A1 | 5/2004 | Murthy et al. |
| 2005/0106792 | A1* | 5/2005 | Cea et al. .................. 438/197 |
| 2005/0285187 | A1 | 12/2005 | Bryant et al. |
| 2005/0287752 | A1 | 12/2005 | Nouri et al. |

OTHER PUBLICATIONS

Ernst et al., "A New Si:C Epitaxial Channel nMOSFET architecture With Improved Drivability and Short-Channel Characteristics," 2003 IEEE Symposium on VLSI Technology Digest of Technical Papers, pp. 51-52.

Shima et al., "<100> Channel Strained—SiGe p-MOSFET With Enhanced Hole Mobility and Lower Parasitic Resistance," 2002 Symposium on VLSI Technology Digest of Technical Papers, pp. 94-95.

Ouyang, Qiqing Christine et al., "Built-in Longitudinal Field Effects in Sub-100-nm Graded Si1-xGex Channel PMOSFETs"; IEEE Transactions on Electron Devices, Jun. 2001, vol. 48, No. 6, pp. 1245-1250.

Gannavaram, Shyam et al.; "Low Temperature ($\leq 800°$ C) Recessed Junction Selective Silicon-Germanium Source/ Drain Technology for sub-70 nm CMOS," IEEE, IEDM 2000, pp. 18.3.1-18.3.4.

Öztürk, M.C. et al.; "Ultra-Shallow Source/Drain Junctions for Nanoscale CMOS Using Selective Silicon-Germanium Technology," Extended Abstracts of International Workshop on Junction Technology, 2001, pp. 5-1-1 thru 5-1-6.

Ghani et al., "A 90nm High Volume Manufacturing Logic Technology Featuring Novel 45nm Gate Length Strained Silicon CMOS Transistor," IEEE, 2003, 3 pgs.

Sleight et al., Stress Induced Defects and Transistor Leakage for Shallow Trench Isolated SOI, IEEE Electron Device Letters, vol. 20, No. 5, May 1999, pp. 248-250.

Streit, Dwight C. et al., "High Performance HBT's with Built-in Base Fields: Exponentially-Graded Doping vs Graded Composition," Proceedings IEEE/Cornell Conference on Advanced Concepts in High Speed Semiconductor Devices and Circuits, Aug. 5-7, 1991, pp. 325-333.

PCT/US2005/026543 International Search Report and Written Opinion mailed Aug. 14, 2006.

PCT/US2005/025535 International Search Report and Written Opinion mailed Mar. 17, 2006.

Restriction mailed Dec. 4, 2006 in U.S. Appl. No. 10/925,108.

Rejection mailed Jun. 16, 2006 in U.S. Appl. No. 10/925,108.

Notice of Allowance mailed Jul. 5, 2007 in U.S. Appl. No.10/925,108.

Restriction mailed Jan. 25, 2006 in U.S. Appl. No. 10/924,650.

Rejection mailed Mar. 17, 2006 in U.S. Appl. No. 10/924,650.

Notice of Allowance mailed Jun. 29, 2006 in U.S. Appl. No. 10/924,650.

* cited by examiner

US 7,872,311 B2

METHOD AND APPARATUS FOR MOBILITY ENHANCEMENT IN A SEMICONDUCTOR DEVICE

FIELD OF THE INVENTION

This invention relates to semiconductor devices, and more particularly, to semiconductor devices that have enhanced mobility.

RELATED ART

In the manufacture of semiconductor devices, silicon has been by far the most popular choice for the semiconductor material. Transistor performance has been enhanced regularly through a variety of process improvements. One of the improvements has been to alter the stress in the silicon in order to improve mobility. Some of the techniques have included using other materials in addition to the silicon to bring about the stress and the consequent mobility improvement. For example, a silicon layer that has germanium added results in a silicon germanium layer that is under compressive stress. Such a silicon germanium layer under compressive stress is useful in improving the mobility of the carriers for a P channel transistor. Finding ways to create tensile stress is for improving the carriers for an N channel transistor.

A variety of techniques have been developed for achieving both tensile and compressive stresses. The mobility improves with increases in stress but ultimately, enough increase in stress causes fractures in the crystal lattice, which renders it useless for semiconductor manufacturing. Another issue is that a typical stress enhancing technique is useful in improving mobility in only one of either short channel or long channel transistors. For example, the typical problem with a bi-axial stress is that it does little to improve the mobility of carriers in a short channel transistor. On the other hand, the typical problem with a uni-axial stress is that it does little to improve mobility of carriers in a long channel transistor. Thus, the mobility enhancements cause changes in mobility with changes in channel length, which makes it more difficult to provide models for the transistors, which in turn makes it more difficult to design circuits using transistors with these mobility enhancements.

Thus, there is a need to provide mobility enhancements that improve on one or more of the problems noted above.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, transistors have enhanced carrier mobility by having the channel region under both a uni-axial stress and a bi-axial stress. The result is that mobility is enhanced for both short and long channel transistors and difference in mobility between the long channel and short channel transistors is lessened. This is better understood by reference to the figures and the following description.

Figure 1:
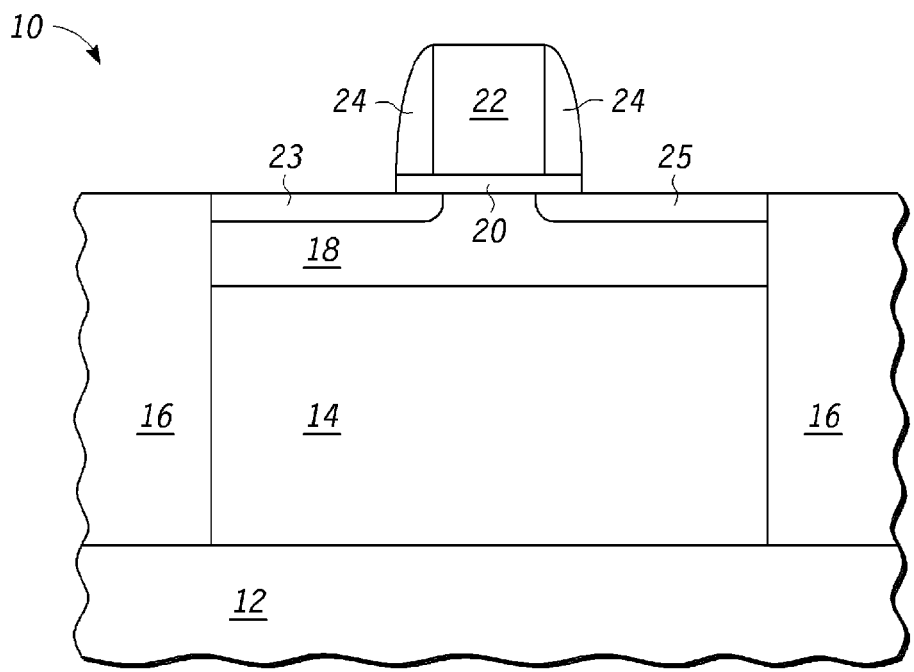
FIG. 1 is a cross section of a semiconductor structure at a first stage in processing according to a first embodiment of the invention.

Shown in FIG. 1 is a semiconductor structure 10 comprising a an insulating layer 12, a semiconductor layer 14 on insulating layer 12, a trench isolation 16 over insulating layer 12 and surrounding semiconductor layer 14, a semiconductor layer 18 on semiconductor layer 14, a gate dielectric 20, over a gate 22, a sidewall spacer 24 around gate 24, a source/drain extension region 23 on one side of gate 22, and a source/drain extension 25 on another side of gate 22. Semiconductor layer 18 is epitaxially grown on semiconductor layer 14. Thus semiconductor layer 18 matches the crystalline structure and nearly matches the crystal spacing of semiconductor layer 14. Due to the forced near matching of the crystal spacing due to the epitaxial growth, the change in material between semiconductor layers 14 and 18 causes a stress change between the two. That the crystal spacing is different, albeit by a relatively small amount, between semiconductor layers 14 and 18 does mean that there is a stress difference.

For the N channel case, semiconductor layer 14 is preferably silicon and semiconductor layer 18 is preferably silicon carbide. The silicon is preferably relaxed with the result that the silicon carbide is under bi-axial tensile stress. In the alternative, semiconductor layer 14 may be at least partially relaxed silicon germanium and semiconductor layer 18 can be either silicon or silicon carbide either which would be under bi-axial tensile stress.

For the P channel case, semiconductor layer 14 is preferably silicon and semiconductor layer 18 is preferably silicon germanium. The silicon may be relaxed with the result that the silicon germanium is under bi-axial compressive stress. In the alternative, semiconductor layer 14 may be another semiconductor material on which can be grown semiconductor layer 18 to be under bi-axial compressive stress.

Figure 2:
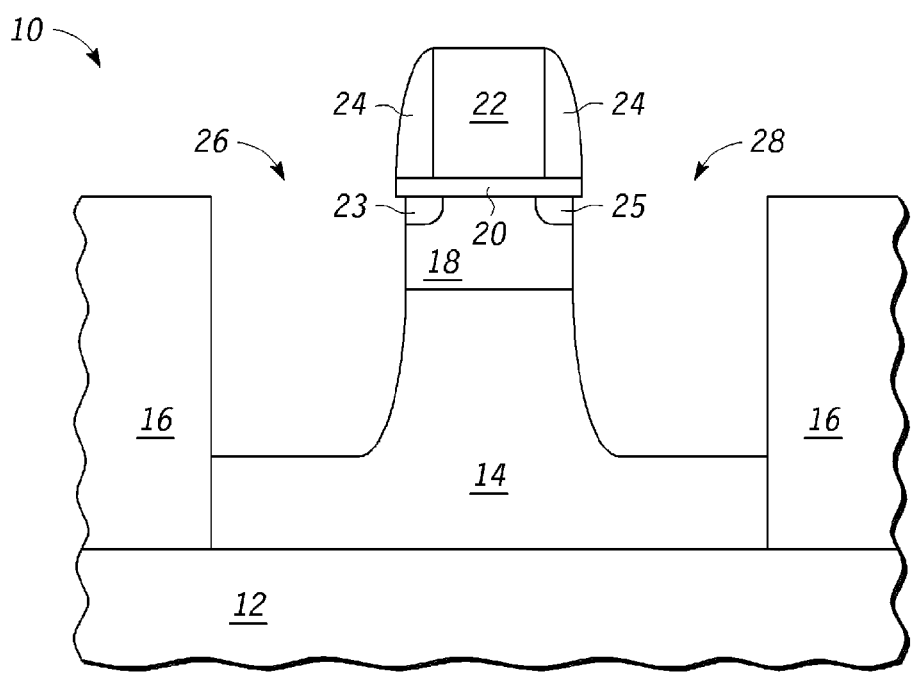
FIG. 2 is a cross section of the semiconductor structure of FIG. 1 at a subsequent stage in processing.

Shown in FIG. 2 is semiconductor structure 10 after etching source/drain extensions 23 and 25, semiconductor layer 18, and semiconductor layer 14, to leave a recess 26 on the one side of gate 22 and a recess 28 on the other side of gate 22.

Figure 3:
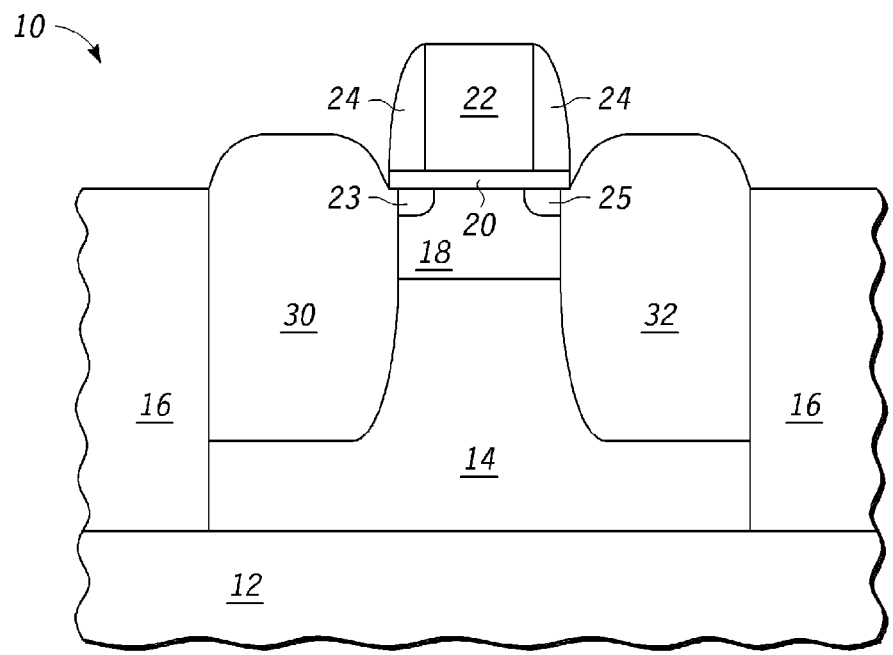
FIG. 3 is a cross section of the semiconductor structure of FIG. 2 at a subsequent stage in processing.

Shown in FIG. 3 is semiconductor structure 10 after filling recesses 26 and 28 with a semiconductor fill 30 and a semiconductor fill 32, respectively. Semiconductor fills 30 and 32 can be in situ doped or doped by implant to become source/drain regions. The material for semiconductor fills 30 and 32 is the same as the material type for semiconductor layer 18 but may have a different ratio of the elements thereof. For example, for the N channel case, the semiconductor material may be silicon carbide for the case in which semiconductor layer 18 is silicon carbide, but the ratio of silicon to carbon may be different. The silicon carbide case creates a uni-axial tensile stress in semiconductor layer 18. Similarly for the P channel case, semiconductor fills 30 and 32 may be silicon germanium for the case in which semiconductor layer is silicon germanium but the ratios of silicon to germanium may be different. The silicon germanium case creates a uni-axial compressive stress in semiconductor layer 18. Semiconductor fills 30 and 32 are stressors that can provide either compressive or tensile stress, depending on the material, that is uni-axial.

The resulting semiconductor device 10 of FIG. 3 thus has a semiconductor region 18 that is used as channel that is under both uni-axial stress and bi-axial stress. Thus mobility is enhanced for both long channel and short channel. By adjusting the amount of stress of each type, the mobility can be held much closer to being the same for both the long and short channel cases.

Figure 4:
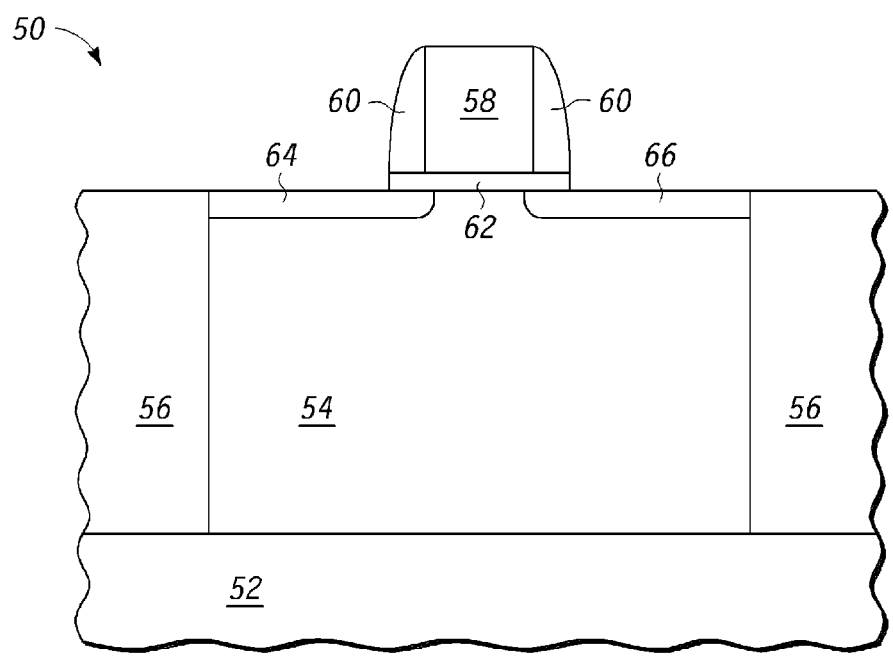
FIG. 4 is a cross section of a semiconductor structure at a first stage in processing according to a second embodiment of the invention.

Shown in FIG. 4 is a semiconductor structure 50 structure 50, comprising an insulating layer 52, a semiconductor layer 54 of silicon germanium that is partially relaxed on insulating layer 52, a trench isolation 56 surrounding semiconductor layer 54, a gate dielectric 62 on semiconductor layer 54, a gate on gate dielectric 62, a sidewall spacer 60 surrounding gate 58, a source/drain extension 64 in semiconductor layer 54 on one side of gate 58, and a source/drain extension 66 in semiconductor layer 54 on another side of gate 58. This structure is for a P channel transistor because partially relaxed silicon germanium provides enhanced hole mobility due to its bi-axial compressive stress.

Figure 5:
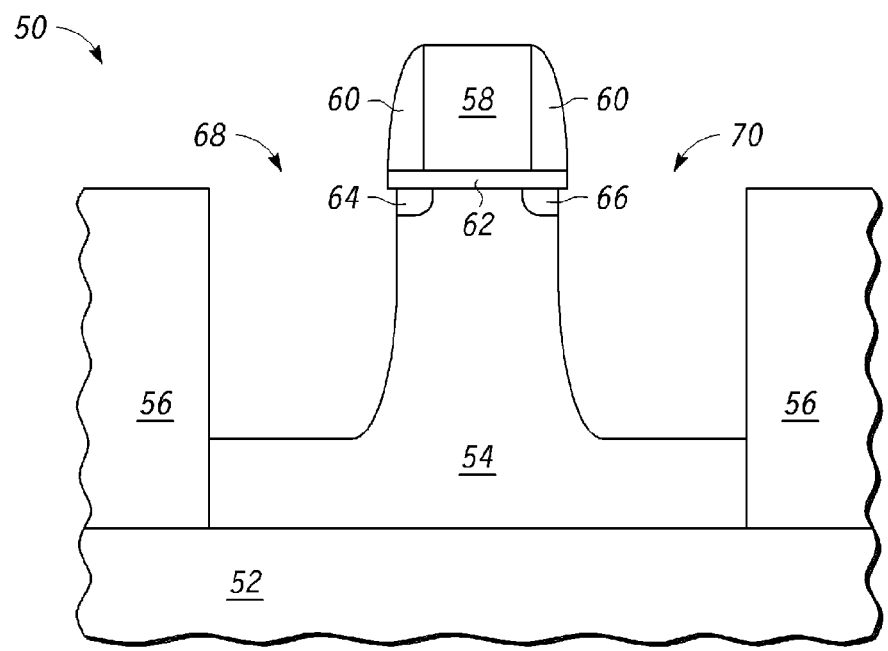
FIG. 5 is a cross section of the semiconductor structure of FIG. 4 at a subsequent stage in processing.

Shown in FIG. 5 is semiconductor structure 50 after etching through source/drain extensions 64 and 66 and into semiconductor layer 54, to leave a recess 68 on the one side of gate 58 and a recess 70 on the other side of gate 58.

Figure 6:
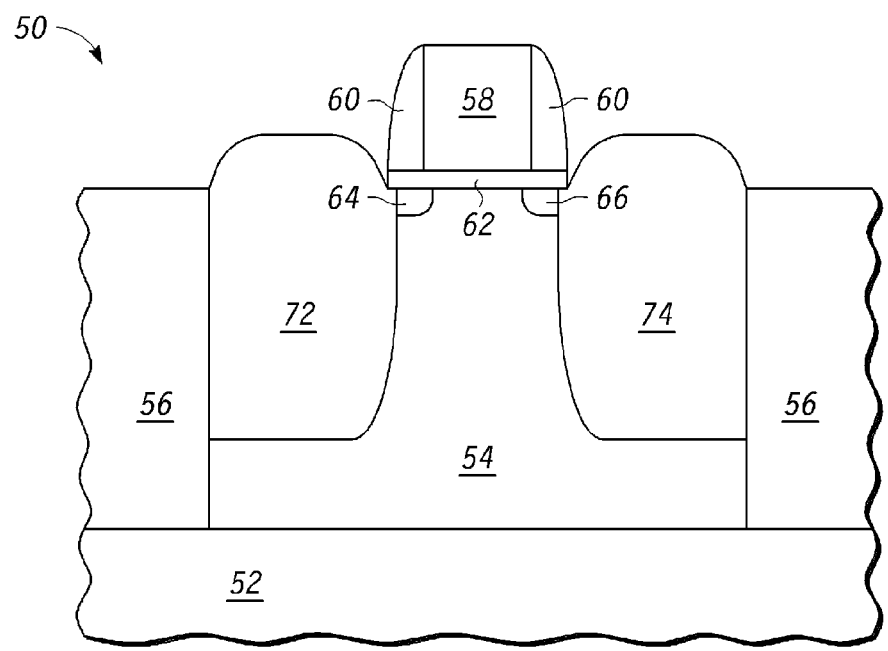
FIG. 6 is a cross section of the semiconductor structure of FIG. 6 at a subsequent stage in processing.

Shown in FIG. 6 is semiconductor structure 50 after filling recesses 68 and 70 with a semiconductor fill 72 and a semiconductor fill 74, respectively. The material for semiconductor fills 72 and 74 is the same as the material type for semiconductor layer 54 but may have a different ratio of the elements thereof. Thus in this example in which semiconductor layer 54 is silicon germanium, the ratio of silicon to germanium in semiconductor fills 72 and 74 may be different than for semiconductor layer 54. Semiconductor fills 72 and 74 can be in situ doped or doped by implant to become source/drain regions. In this semiconductor device 50, semiconductor layer 54, as partially relaxed silicon germanium, has a bi-axial compressive stress and further there is applied an additional compressive stress that is uni-lateral through the formation of semiconductor fills 72 and 74. The result is a device structure that has both uni-axial and bi-axial stress. In this case, it is a compressive stress that is useful for P channel transistors, but with different semiconductor materials it could be a tensile stress that would be useful for N channel transistors.

Figure 7:
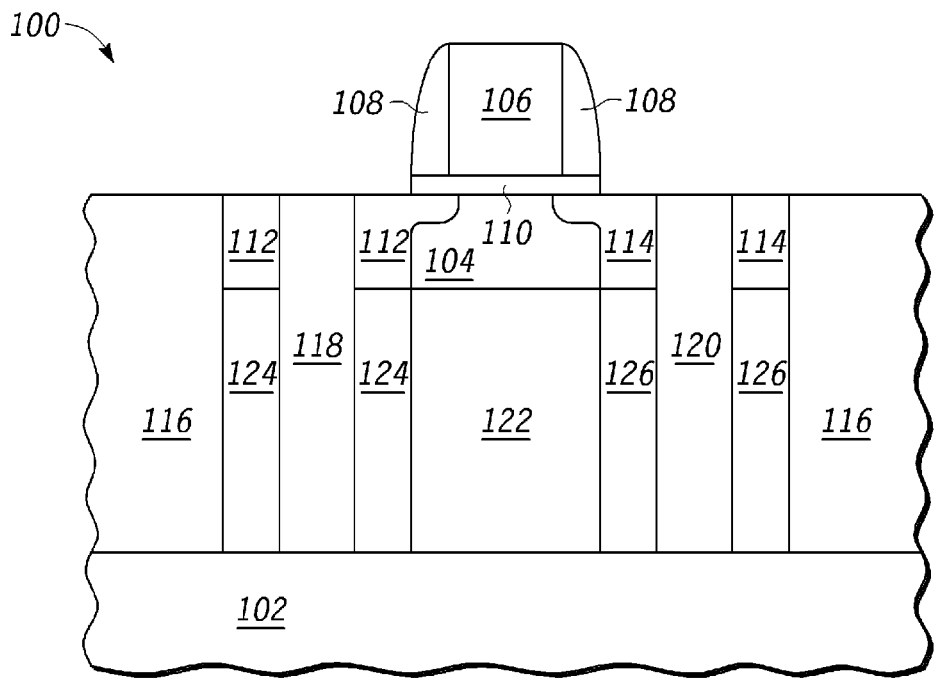
FIG. 7 is a cross section semiconductor structure according to an alternative in using the invention.

Shown in FIG. 7 is a semiconductor device 100 comprising an insulating layer 102, a semiconductor body 122 on insulating layer 102, a semiconductor body 104 on semiconductor body 122, a trench isolation 116 surrounding semiconductor bodies 122 and 104, a gate dielectric 110 on semiconductor body 104, a gate 106 on gate dielectric 110, a sidewall spacer 108 surrounding gate 106, a source/drain region 124 in semiconductor body 122 on one side of gate 106, a source/drain region 126 in semiconductor body 122 on the other side of gate 106, a source/drain region 112 in semiconductor body 104 on the one side of gate 106, a source/drain region 114 in semiconductor body 104 on the other side of gate 106, an insulator plug 118 spaced from gate 106 and through source/drain regions 112 and 124 to insulating layer 102, and an insulator plug 120 spaced from gate 108 and through source/drain regions 114 and 126.

For the P channel case, semiconductor layer 122 is preferably silicon and semiconductor layer 104 is preferably silicon germanium. The silicon may be relaxed with the result that the silicon germanium is under compressive stress. In the alternative, semiconductor layer 122 may be another semiconductor material on which can be grown semiconductor layer 104 to be under compressive stress.

Figure 8:
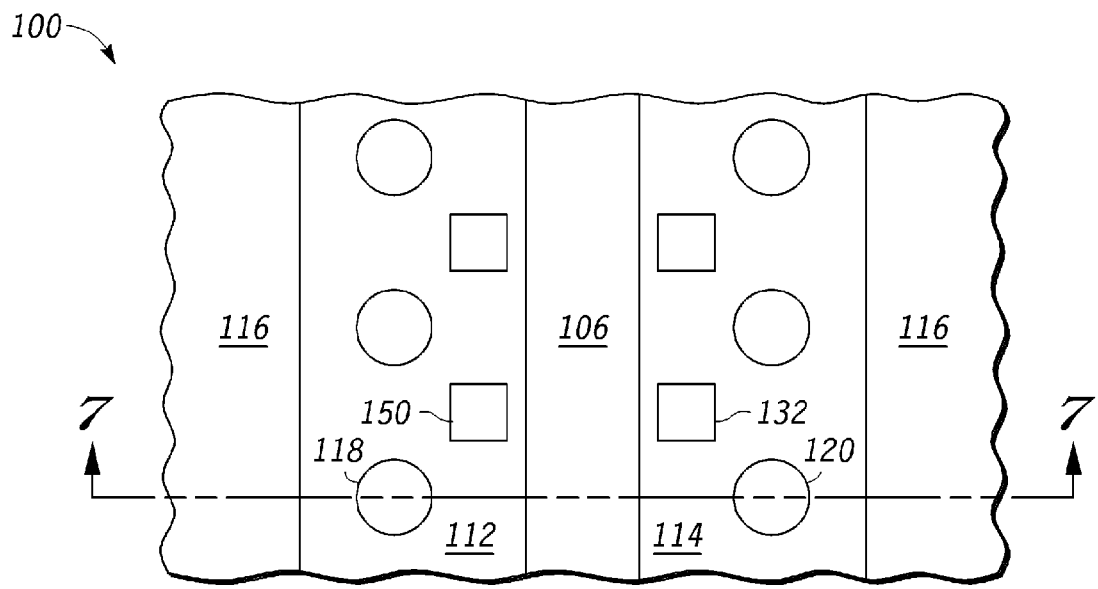
FIG. 8 is a top view of the semiconductor structure of FIG. 7.

Shown in FIG. 8 is a top view of semiconductor device 100 and showing where the cross section for FIG. 7 is taken. This shows insulator plug 118 through source/drain region 112 and that there are plurality of such insulation plugs on the one side of gate 106 between gate 106 and trench isolation 116. Similarly there is shown insulator plug 120 on the other side of gate 106 and that there are a plurality of such insulator plugs through source/drain region 114. These isolation plugs, which are stressors, are formed at the same time and in the same way as trench isolation 116. This is achieved by an oxide liner and an oxide, such as TEOS, fill. This semiconductor device 100 is an alternative approach for providing a uni-axial stress. In this case the uni-axial stress is a compressive stress in semiconductor body 104.

In the foregoing specification, the invention has been described with reference to specific embodiments. However, one of ordinary skill in the art appreciates that various modifications and changes can be made without departing from the scope of the present invention as set forth in the claims below. For example, a technique for obtaining uni-axial stress was described in FIGS. 1-6 but other alternatives may also be used such as that shown in FIGS. 7 and 8. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   a substrate having an insulating layer;
   a silicon layer directly on the insulating layer of the substrate;
   a channel region comprising a SiGe layer directly on the silicon layer, the channel region being bi-axially stressed;
   a gate dielectric directly on the SiGe layer;
   a gate directly on the gate dielectric;
   source and drain regions formed over the substrate, the source and drain regions providing uni-axial stress to the channel region, wherein the source drain region comprise SiGe of a silicon to germanium ratio different from that of the channel region.

2. The semiconductor device of claim 1, wherein the substrate is a semiconductor substrate.

3. The semiconductor device of claim 1, wherein the semiconductor device is a transistor having P-type conductivity.

4. The semiconductor device of claim 1, wherein the semiconductor device is a transistor having N-type conductivity.

5. The semiconductor device of claim 1, wherein the source and drain regions comprises:
   a first layer comprising silicon formed over the substrate;
   source and drain extensions formed in the first layer, wherein a predetermined amount of the first layer is removed from the source and drain extensions to form source and drain recesses;
   a first stressor formed in the source region comprising insulating material extending through the source region to the silicon layer; and
   a second stressor formed in the drain region comprising insulating material extending through the drain region to the silicon layer, wherein the first and second stressors for providing the uni-axial stress to the channel region.

* * * * *